(12) United States Patent
Aram et al.

(10) Patent No.: US 7,737,777 B2
(45) Date of Patent: *Jun. 15, 2010

(54) AMPLIFIERS WITH COMPENSATION

(75) Inventors: Farbod Aram, Los Altos Hills, CA (US); Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 12/326,197

(22) Filed: Dec. 2, 2008

(65) Prior Publication Data

US 2009/0140803 A1   Jun. 4, 2009

Related U.S. Application Data

(63) Continuation of application No. 11/503,436, filed on Aug. 11, 2006, now Pat. No. 7,459,972, which is a continuation-in-part of application No. 11/264,921, filed on Nov. 2, 2005, now Pat. No. 7,202,733.

(60) Provisional application No. 60/820,878, filed on Jul. 31, 2006, provisional application No. 60/799,282, filed on May 10, 2006.

(51) Int. Cl.
*H03F 1/24* (2006.01)

(52) U.S. Cl. ............... 330/98; 330/302; 330/310

(58) Field of Classification Search ............... 330/98, 330/302, 310
See application file for complete search history.

(56) References Cited

U.S. PATENT DOCUMENTS

| | | | |
|---|---|---|---|
| 3,079,568 A | 2/1963 | Werth | |
| 3,605,031 A | 9/1971 | Tongue | |
| 4,185,249 A | 1/1980 | McKim et al. | |
| 4,405,899 A | 9/1983 | Wurzburg | |
| 5,121,075 A | 6/1992 | Roach | |
| 5,990,748 A | 11/1999 | Tomasini et al. | |
| 6,002,299 A | 12/1999 | Thomsen | |

(Continued)

OTHER PUBLICATIONS

Application of the Operational Transconductance Amplifier (OTA) to Voltage-controlled Amplifiers and Active Filters; W. Grise, Department of IET, Morehead State University, Morehead, KY; 1998; http://engr.nmsu.edu/~etti/winter98/electronics/grise/wrg.html; 10 pages.

*Primary Examiner*—Patricia Nguyen

(57) ABSTRACT

An amplifier system includes a first amplifier stage having an input and an output. A second amplifier stage has an input and an output, the input of the second amplifier stage being connected to the output of the first amplifier stage. A transistor has a control terminal, a first terminal, and a second terminal, the first terminal of the transistor being coupled to the output of the first amplifier stage and the input of the second amplifier stage. A first capacitance has a first terminal and a second terminal, the first terminal of the first capacitance being connected to the input of the first amplifier stage, the second terminal of the first capacitance being connected to the second terminal of the transistor. A first current source to source current to amplifier system, the first current source being is connected to the output of the first amplifier stage. A second current source will sink current from the amplifier system. The second current source is connected to the second terminal of the first capacitance and the second terminal of the transistor.

20 Claims, 16 Drawing Sheets

U.S. PATENT DOCUMENTS

| | | |
|---|---|---|
| 6,201,442 B1 | 3/2001 | James et al. |
| 6,208,206 B1 | 3/2001 | Leung et al. |
| 6,262,627 B1 * | 7/2001 | Ghiozzi et al. ............... 330/51 |
| 6,340,916 B1 | 1/2002 | Chen et al. |
| 6,407,640 B1 * | 6/2002 | Aparin et al. ............... 330/302 |
| 6,624,704 B1 * | 9/2003 | Varadarajan et al. ........ 330/311 |
| 6,842,068 B2 | 1/2005 | Perrier et al. |
| 6,930,544 B2 | 8/2005 | Yokoyama |
| 6,937,104 B1 | 8/2005 | Varadarajan et al. |
| 7,002,409 B1 | 2/2006 | Aram |
| 7,161,420 B1 | 1/2007 | Aram et al. |
| 7,199,656 B1 | 4/2007 | Aram et al. |
| 7,202,733 B1 | 4/2007 | Aram et al. |
| 7,202,746 B1 | 4/2007 | Kejariwal et al. |
| 7,323,930 B2 | 1/2008 | Aram et al. |
| 7,324,035 B2 * | 1/2008 | Harris et al. ............... 341/155 |

* cited by examiner

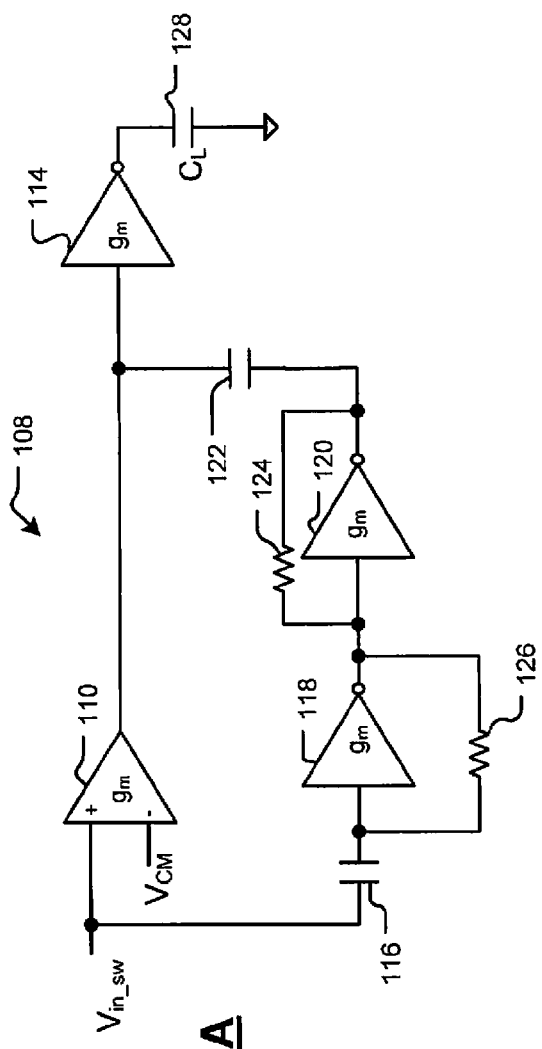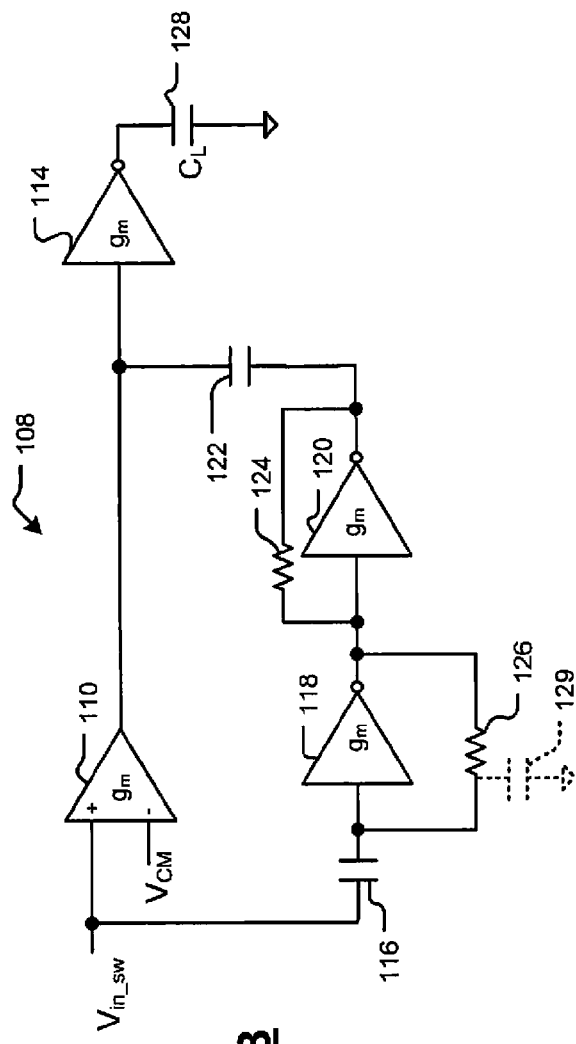
FIG. 7A
FIG. 7B

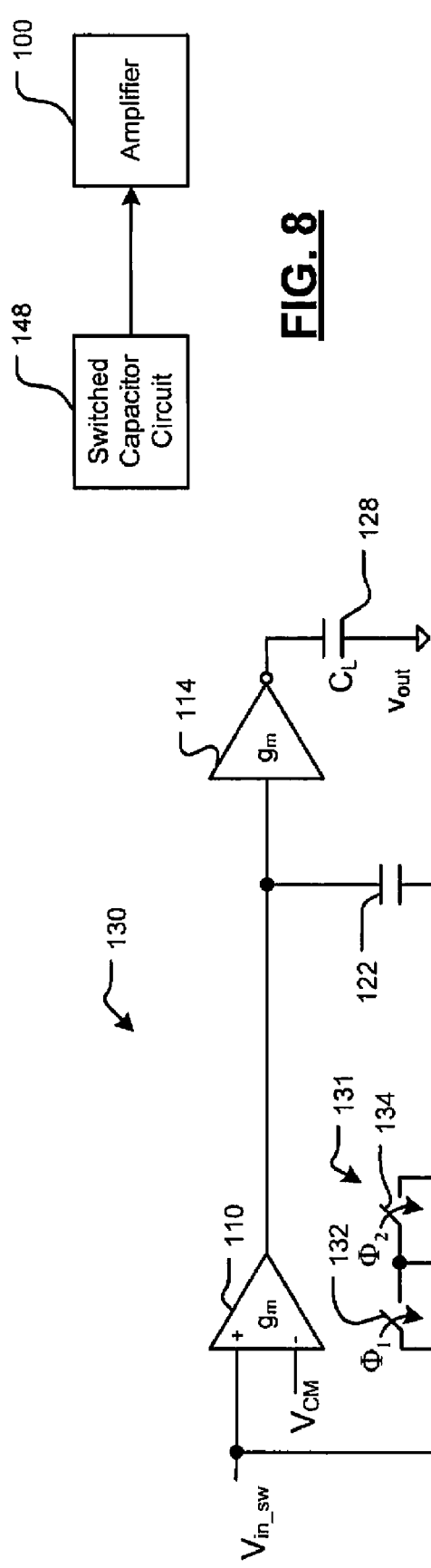
FIG. 7C
FIG. 8
FIG. 9

AMPLIFIERS WITH COMPENSATION

CROSS-REFERENCE TO RELATED APPLICATIONS

This application is a continuation of U.S. patent application Ser. No. 11/503,436, filed Aug. 11, 2006, which claims the benefit of U.S. Provisional Application No. 60/820,878, filed Jul. 31, 2006 and U.S. Provisional Application No. 60/799,282, filed May 10, 2006 and is a continuation-in-part of U.S. patent application Ser. No. 11/264,921 filed Nov. 2, 2005. The disclosures of the above applications are incorporated herein by reference in their entirety.

FIELD OF THE INVENTION

The present invention relates to amplifiers, and more particularly to amplifiers with compensation.

BACKGROUND OF THE INVENTION

An amplifier may include one or more stages. Each stage may include an amplifier that provides gain. As frequency increases, the gain that is provided by the amplifier tends to fall off, which limits the bandwidth of the amplifier. As operating frequencies of electronic computing devices increase, amplifiers having high bandwidth and gain and low noise have become increasingly important.

Miller compensation is a conventional frequency compensation technique that involves the movement of a dominant pole of a gain stage to a lower frequency by increasing the effective input capacitance of the gain stage. Miller compensation circuits include a Miller capacitance that exploits the Miller effect. When the Miller capacitance is connected in a feedback arrangement, the capacitance appears much larger at the input of the amplifier. While the dominant pole may be moved to a lower frequency using this approach, the gain and bandwidth of the system is still somewhat limited.

Referring now to FIGS. 1 and 2, an amplifier circuit 10 with Miller compensation is shown and includes first and second amplifiers 14 and 16, respectively. An output of the first amplifier 14 communicates with an input of the second amplifier 16. A first end of a Miller capacitance 18 communicates with the input of the second amplifier 16 and a second end of the Miller capacitance 18 communicates with the output of the second amplifier 16.

An input voltage of the amplifier circuit 10 is applied to an input of the first amplifier 14. An output voltage of the amplifier circuit 10 is referenced from the output of the second amplifier 16. As a result of the Miller compensation, the transconductance, $g_m$, of the second amplifier 16 may be increased, which increases the bandwidth of the amplifier circuit 10. As can be seen in FIG. 2, the gain of the amplifier with Miller compensation has a 20 dB/decade slope.

Amplifiers may also be used with switched capacitive input signals. The switched capacitive input signals may be generated in analog to digital converters (ADCs), digital to analog converters (DACs), filters and/or other circuits. Traditional amplifiers such as those shown in FIG. 1 tend to have a difficult time providing sufficient gain and bandwidth at acceptable noise levels, particularly for switched capacitive input signals.

SUMMARY OF THE INVENTION

An amplifier system comprises a first amplifier, a second amplifier, a first capacitance, and a first transistor. The first amplifier has an input and an output. The second amplifier has an input that communicates with the output of the first amplifier. The first capacitance has one end that communicates with the input of the first amplifier. The first transistor has a control terminal, a first terminal that communicates with the output of the first amplifier and a second terminal that communicates with another end of the first capacitance.

In another feature, the amplifier system further comprises a first current source that communicates with the second terminal of the first transistor.

In another feature, the amplifier system further comprises a second current source that communicates with the first terminal of the first transistor.

In another feature, the amplifier system further comprises a first current source that communicates with the second terminal of the first transistor and a second current source that communicates with the first terminal of the first transistor.

In another feature, the first and second amplifiers include operational transconductance amplifiers.

In another feature, the first and second amplifiers include operational amplifiers.

In still other features, an amplifier system comprises a first amplifier, a second amplifier, a first capacitance, a second capacitance, and a first transistor. The first amplifier has an input and an output. The second amplifier has an input that communicates with the output of the first amplifier. The first capacitance has one end that communicates with the input of the first amplifier. The second capacitance has one end that communicates with the input of the second amplifier. The first transistor has a control terminal, a first terminal that communicates with another end of the second capacitance and a second terminal that communicates with another end of the first capacitance.

In another feature, the amplifier system further comprises a first current source that communicates with the second terminal of the first transistor.

In another feature, the amplifier system further comprises a second current source that communicates with the input of the second amplifier.

In another feature, the amplifier system further comprises a first current source that communicates with the second terminal of the first transistor and a second current source that communicates with the input of the second amplifier.

In another feature, the first and second amplifiers include operational transconductance amplifiers.

In another feature, the first and second amplifiers include operational amplifiers.

In still other features, an amplifier system comprises first amplifying means having an input and an output, second amplifying means having an input for communicating with the output of the first amplifying means, first capacitance means having one end for communicating with the input of the first amplifying means, and a first transistor having a control terminal, a first terminal for communicating with the output of the first amplifying means and a second terminal for communicating with another end of the first capacitance means.

In another feature, the amplifier system further comprises first current source means for communicating with the second terminal of the first transistor.

In another feature, the amplifier system further comprises second current source means for communicating with the first terminal of the first transistor.

In another feature, the amplifier system further comprises first current source means for communicating with the second terminal of the first transistor and second current source means for communicating with the first terminal of the first transistor.

In another feature, the first and second amplifying means include operational transconductance amplifiers.

In another feature, the first and second amplifying means include operational amplifiers.

In still other features, an amplifier system comprises first amplifying means for amplifying having an input and an output, second amplifying means for amplifying having an input that communicates with the output of the first amplifying means, first capacitance means for providing capacitance having one end for communicating with the input of the first amplifying means, second capacitance means for providing capacitance having one end for communicating with the input of the second amplifying means, and a first transistor having a control terminal, a first terminal for communicating with another end of the second capacitance means and a second terminal for communicating with another end of the first capacitance means.

In another feature, the amplifier system further comprises first current source means for providing current and for communicating with the second terminal of the first transistor.

In another feature, the amplifier system further comprises second current source means for providing current and for communicating with the input of the second amplifying means.

In another feature, the amplifier system further comprises first current source means for providing current and for communicating with the second terminal of the first transistor and second current source means for providing current and for communicating with the input of the second amplifier.

In another feature, the first and second amplifying means include operational transconductance amplifiers.

In another feature, the first and second amplifying means include operational amplifiers.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 7A is an electrical schematic of an exemplary amplifier according to the present invention;

FIG. 7B is an electrical schematic of the amplifier of FIG. 7A with parasitic capacitance;

FIG. 7C is an electrical schematic of an amplifier according to the present invention with a switched capacitance circuit;

FIG. 8 is a functional block diagram illustrating an exemplary switched input comprising a switched capacitance circuit and the amplifier of FIG. 7C;

FIG. 9 is a functional block diagram and electrical schematic illustrating an exemplary switched capacitance circuit;

DETAILED DESCRIPTION OF THE PREFERRED EMBODIMENTS

Figure 1:
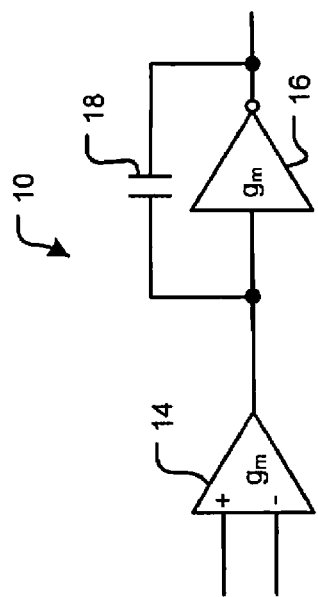
FIG. 1 is an electrical schematic of an amplifier with Miller compensation according to the prior art.
Figure 2:
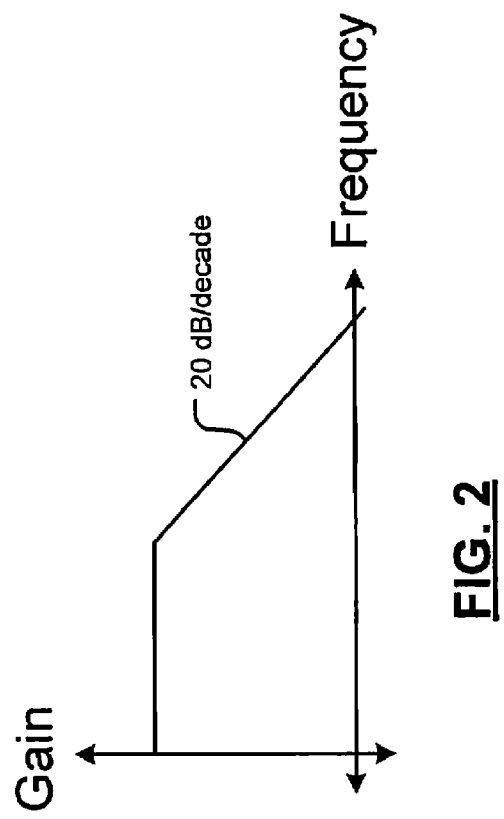
FIG. 2 is a graph illustrating gain and bandwidth for the amplifier of FIG. 1.

The following description of the preferred embodiment(s) is merely exemplary in nature and is in no way intended to limit the invention, its application, or uses. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present invention. For purposes of clarity, the same reference numbers will be used in the drawings to identify similar elements.

Figure 3B:
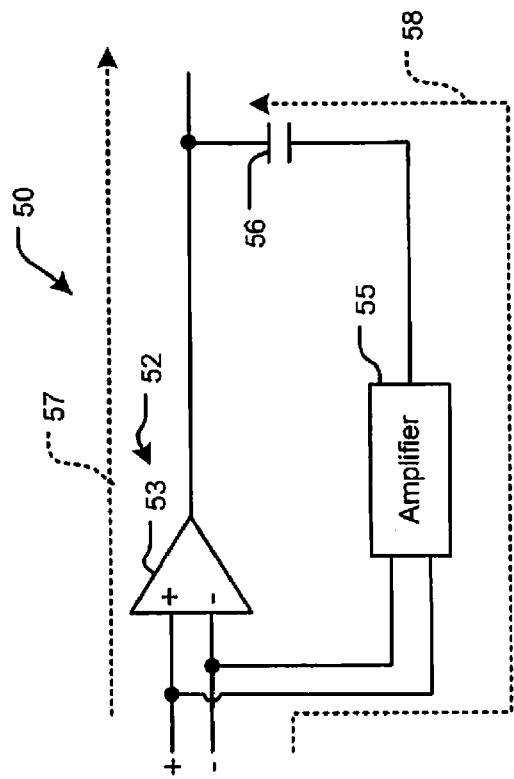
FIG. 3B is an electrical schematic of an exemplary amplifier with compensation according to the present invention.
Figure 3A:
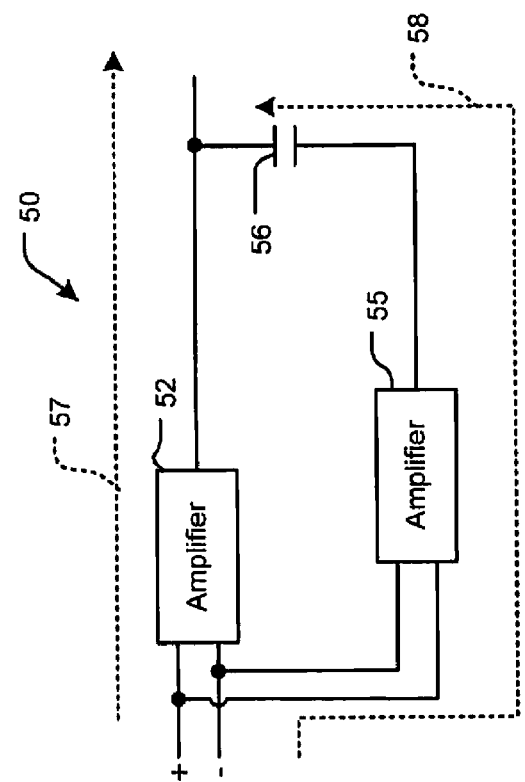
FIG. 3A is an electrical schematic of an exemplary amplifier with compensation according to the present invention.

Referring now to FIG. 3A, an electrical schematic of an amplifier circuit 50 with compensation according to the present invention is shown. While specific examples of amplifier circuits will be shown and described, other combinations are contemplated. The amplifier circuit 50 includes a first amplifier module 52 having an input and an output. The inputs of the amplifier module 52 communicate with inputs of an amplifier module 55. Outputs of the amplifier module 55 are coupled by a capacitance 56 to the output of the amplifier module 52.

The amplifier module 55 may have a gain that is less than the gain of the amplifier module 52. The amplifier module 52 may have a gain that is greater than or equal to 100. The amplifier module 55 may have a gain that is less than 100. In some implementations, the gain of the amplifier module 55 is substantially less than 100. The amplifier module 55 may have a very high bandwidth and a low output impedance. The amplifier module 55 may have a bandwidth that is greater than a bandwidth of the amplifier module 52. The output impedance of the amplifier module 52 may be greater than the output impedance of the amplifier module 55. The amplifier module 55 may include a transimpedance amplifier. The amplifier circuit 50 has a first DC path 57 and a second high frequency path 58.

Figure 3C:
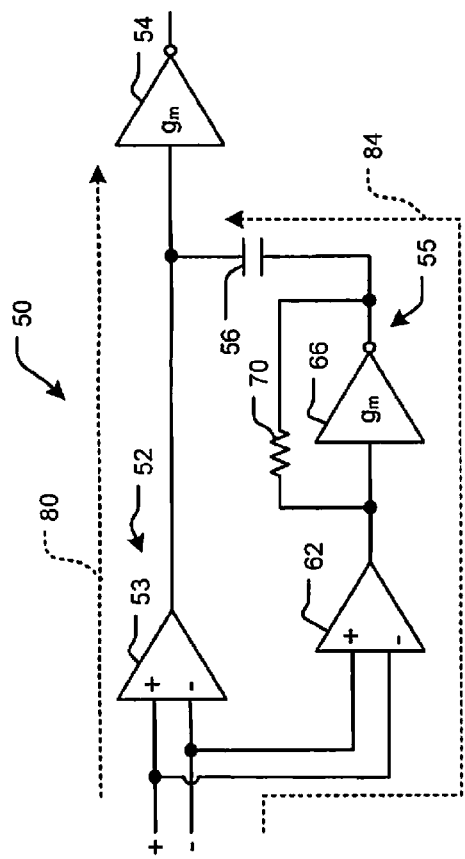
FIG. 3C is an electrical schematic of an exemplary amplifier with compensation according to the present invention.
Figure 3D:
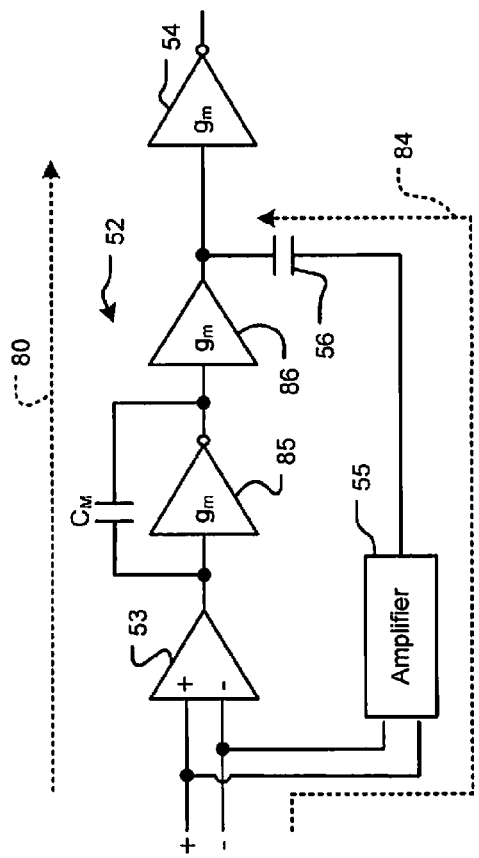
FIG. 3D is an electrical schematic of an exemplary amplifier with compensation according to the present invention.

Referring now to FIGS. 3B-3D, various combinations of amplifiers can be used in the amplifier modules 52 and 55 of the amplifier circuit 50. While specific examples will be shown, other combinations are contemplated. In FIG. 3B, the amplifier module 52 may include an amplifier 53. In FIG. 3C, the amplifier module 55 may include a transimpedance amplifier. In FIG. 3D, the amplifier module 52 may include a Miller compensated amplifier. Still other variations are contemplated.

Referring back to FIG. 3C, the amplifier circuit 50, which includes the amplifier module 52 that includes a first amplifier 53 having an output that communicates with an input of a second amplifier 54. Inputs of the amplifier 53 are coupled to the amplifier module 55. The amplifier module 55 includes an amplifier 62, an amplifier 66 and a feedback resistance 70. An output of the amplifier 62 is coupled to an input of the amplifier 66. The feedback resistance 70 is connected between the input of the amplifier 66 and an output of the amplifier 66. A capacitance element 56 capacitively couples the output of the amplifier 66 to the input of the amplifier 54. The amplifiers 53 and 54 provide a DC gain path 80. Gain of the DC gain path 80 can be adjusted using additional amplifiers. The amplifiers 62 and 66 and the capacitance 56 provide a high-frequency gain path 84.

Referring now to FIG. 3D, the amplifier module 52 may include the amplifier 53 and a Miller compensated amplifier 85 with capacitive feedback $C_M$. An additional amplifier 86 may be provided between the output of the Miller compensated amplifier 85 and the input of the amplifier 54. Still other combinations are contemplated.

Figure 4A:
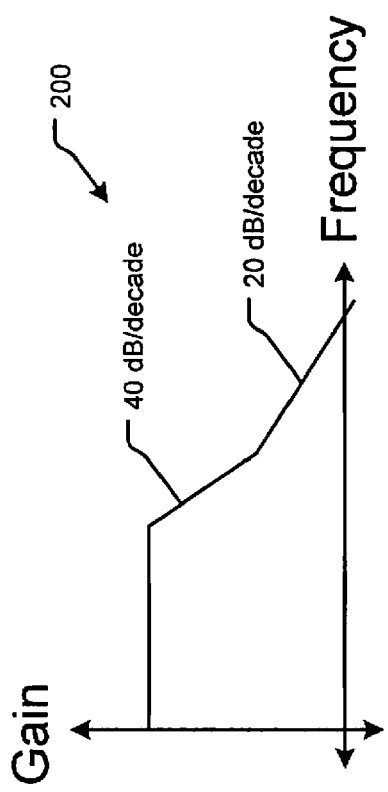
FIGS. 4A-4C are graphs illustrating exemplary gain and bandwidth for the amplifiers.
Figure 4C:
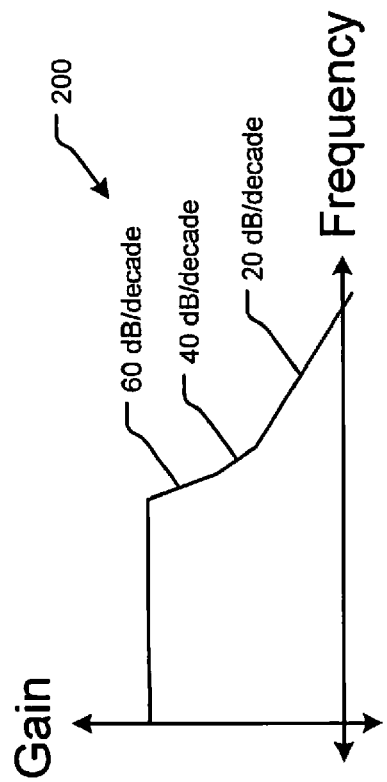
Figure 4B:
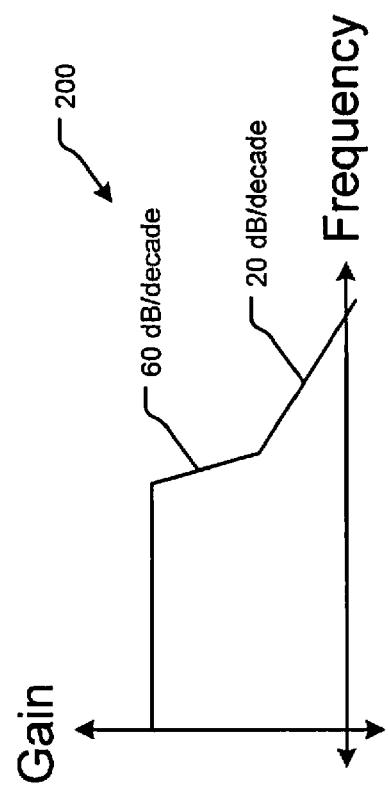

Referring now to FIGS. 4A-4C, exemplary graphs illustrating gain and bandwidth for the amplifier circuits are shown. As can be appreciated, the amplifier circuit 50 in FIG. 3A has additional bandwidth at higher gain values. A slope of the gain is increased to 40 dB/decade such that the gain falls off later but more quickly. Additional gain stages may further increase the slope to 60 dB/decade as shown in FIG. 4B. Depending upon the stages and/or configuration, regions of the gain-bandwidth response may have a slope of 20, 40, 60, etc dB/decade as shown in FIG. 4C.

Figure 5:
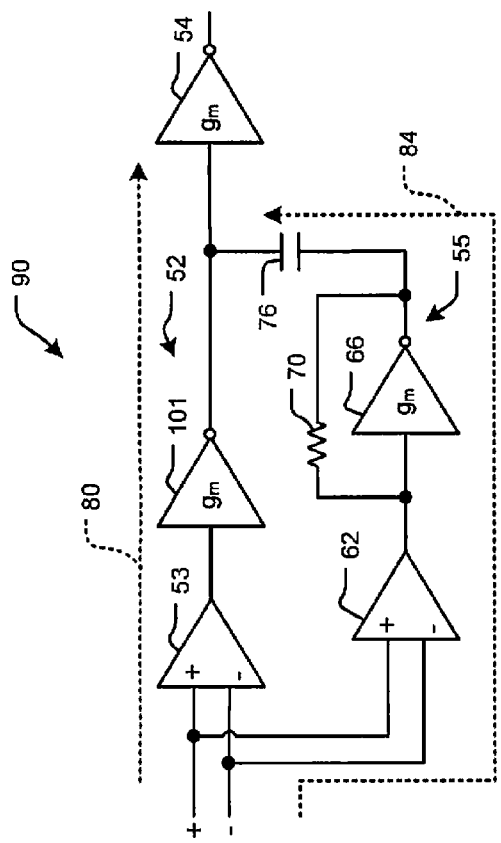
FIGS. 5 and 6 are electrical schematics of amplifiers with compensation and additional gain stages according to the present invention.
Figure 6:
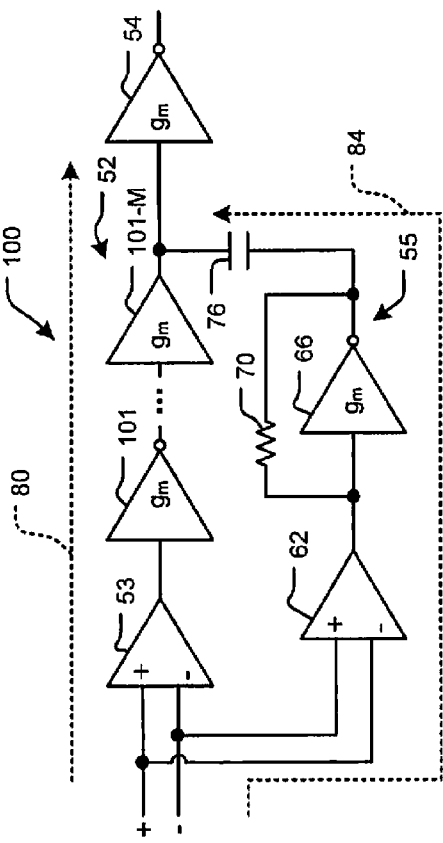

Referring now to FIGS. 5 and 6, electrical schematics of other amplifiers with compensation and additional gain are shown. One or more additional amplifiers may be provided in the DC gain path 80 to provide additional gain. In FIG. 5, an amplifier circuit 90 includes amplifiers 53 and 101 that are connected between the input of the amplifier 90 and the amplifier 54. In FIG. 6, an amplifier circuit 100 includes one or more additional amplifiers 101-M that are connected between amplifiers 52-2 and 54, where M is an integer greater than one. As can be appreciated, additional amplifier stages may be added to the DC path to provide additional gain as needed.

The amplifier circuits according to the present invention have improved gain at both high and low frequency and improved settling time. The amplifier circuits have high gain while operating at low voltage because each stage can now be configured in a non-cascode arrangement.

Referring now to FIGS. 7A and 7B, an amplifier circuit 108 includes an amplifier 110 having an input and an output that is coupled to an input of an amplifier 114. The input of the amplifier 110 is coupled by a capacitance 116 to an input of an amplifier 118. An output of the amplifier 118 is coupled to an input of the amplifier 120. An output of the amplifier 120 is coupled by a capacitance 122 to the input of the amplifier 114.

A feedback resistance 124 is connected to the input and output of the amplifier 120. A feedback resistance 126 is connected to the input and output of the amplifier 118. The feedback resistance 126 may have a high resistance value. For example, the feedback resistance may have a resistance value that is greater than a resistance value of the resistance 124. The feedback resistance 126 may have a very high resistance, for example a resistance approaching infinity. A load capacitance 128 may be connected to an output of the amplifier 114. In FIG. 7B, parasitic capacitance 129 associated with the relatively high feedback resistance 126 may tend to limit bandwidth of the circuit.

In FIG. 7C, an amplifier circuit 130 according to the present invention is shown. The amplifier circuit 130 may include a switched capacitance to simulate the high feedback resistance 126 without the problems associated with parasitic capacitance. The amplifier circuit 130 includes an amplifier 110 having an output that is coupled to an input of an amplifier 114. An input of the amplifier 110 is also coupled by a capacitance 116 to an input of an amplifier 118. An output of the amplifier 118 is coupled to an input of the amplifier 120. An output of the amplifier 120 is coupled by a capacitance 122 to the input of the amplifier 114.

The input and output of the amplifier 118 may communicate with a switched capacitance circuit 131. The switched capacitance circuit 131 includes first and second switches 132 and 134. A capacitance 136 is connected between the switches 132 and 134 and a reference potential such as ground. During a first phase $\Phi_1$, the first switch 132 is closed and the second switch 134 is open and the capacitance 136 is charged. During a second phase $\Phi_2$, the first switch 132 is open and the second switch 134 is closed, which allows the capacitance 136 to discharge. The first and second phases may correspond to the first and second phases of the switched input and/or vice versa. A feedback resistor 124 is connected to the input and output of the amplifier 120. A load capacitance 146 may be connected to an output of the amplifier 114. In some applications, the amplifier 130 may receive a switched input. The switched input may be a switched capacitive input such as that found in capacitive ADCs, DACs, filters and the like.

Referring now to FIGS. 8 and 9, an exemplary circuit comprising a switched capacitance circuit 148 and the amplifier 130 of FIG. 7C are shown. An input voltage to the amplifier circuit 130 may be a switched capacitance input. Switched capacitance inputs may be generated in circuits such as filters, digital to analog converters (DAC), analog to digital converters (ADC) and other circuits. As can be appreciated, other types of input and/or other switched capacitance circuits may be used. The switched capacitance circuit 148 includes first and second switches 152 and 154. A capacitance 158 is connected between the switches 152 and 154 and a reference potential such as ground. During a first phase $\Phi_1$, the first switch 152 is closed and the second switch 154 is open and the capacitance 158 is charged. During a second phase $\Phi_2$, the first switch 152 is open and a second switch 154 is closed and the capacitance 158 discharges via the amplifier 100.

Figure 10:
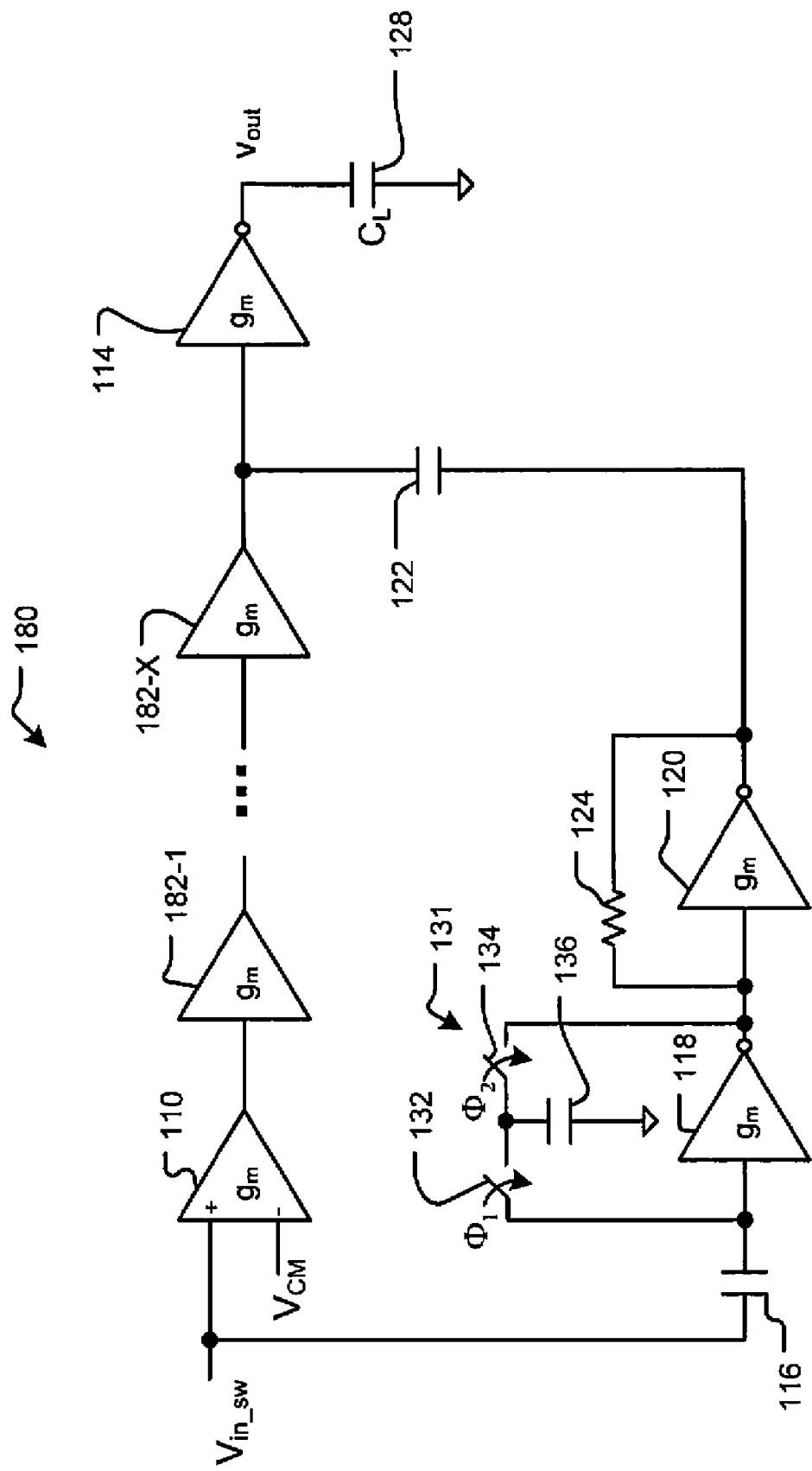
FIG. 10 is an electrical schematic of the amplifier of FIG. 7C with additional amplifier stages.

Referring now to FIG. 10, an amplifier circuit 180 is similar to that shown in FIG. 7C and further includes amplifiers 182-1, 182-2, . . . 182-X, where X is an integer greater than zero. The additional amplifiers 182 tend to increase the slope of the gain-bandwidth response in a region 200 shown in FIG. 4.

Figure 11:
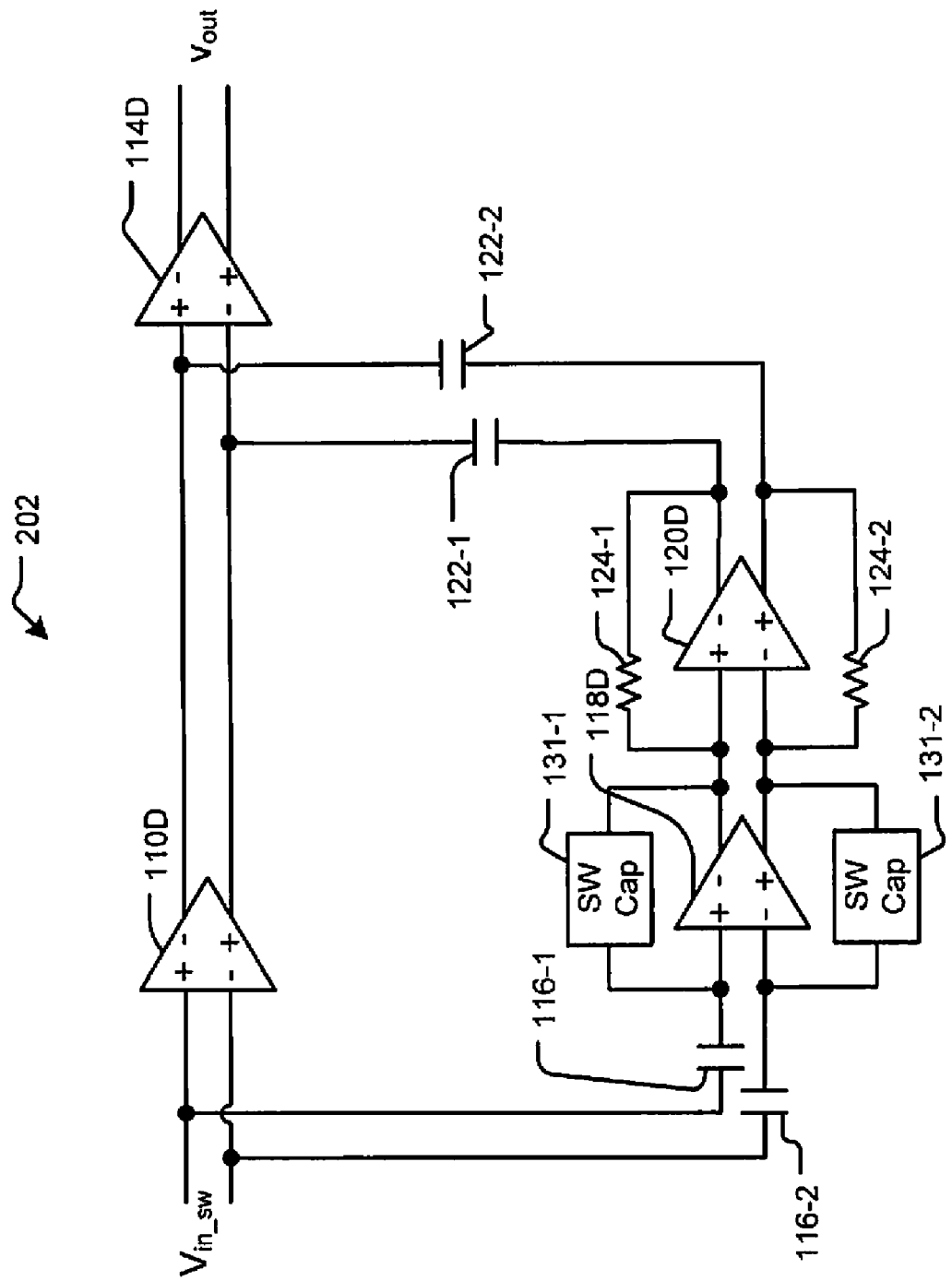
FIG. 11 is electrical schematic of the amplifier of FIG. 7C configured in a differential mode.

Any of the amplifier circuits described above can be configured in a differential mode. For example and referring now to FIG. 11, the amplifier of FIG. 7C can be configured in a differential mode. Other amplifiers described herein may be configured in a differential mode as well. An amplifier 202 according to the present invention that receives a differential switched input is shown. The amplifier 202 includes a differential amplifier 110D having differential outputs that are coupled to differential inputs of a differential amplifier 114D. Differential inputs of the differential amplifier 110D are also coupled by capacitances 116-1 and 116-2 to differential inputs of a differential amplifier 118D. Differential outputs of the differential amplifier 118D are coupled to differential inputs of the differential amplifier 120D. Differential outputs of the differential amplifier 120D are coupled by capacitances 122-1 and 122-2 to the differential inputs of the differential amplifier 114D.

The differential inputs and differential outputs of the differential amplifier 118D communicate with switched capacitance circuits 131-1 and 131-2. Load capacitances (not shown) may be connected to differential outputs of the differential amplifier 114D.

The amplifiers described herein may be amplifiers, operational amplifiers, operational transconductance amplifiers (OTAs), amplifiers with Miller compensation and/or other suitable amplifiers. The OTA is a transconductance type device. The input voltage controls an output current based on the transconductance $g_m$. In other words, the OTA is a voltage-controlled current source (VCCS), which is in contrast to the conventional amplifier (opamp), which is a voltage-controlled voltage source (VCVS).

The transconductance parameter of the OTA is controlled by an amplifier bias current. From this controlled transconductance, the output current is a function of the applied voltage difference between the input pins. There are two key differences between the OTA and the conventional opamp. First, since the OTA is a current source, the output impedance of the device is high. In contrast, the output impedance of the opamp is very low. Second, it is possible to design circuits using the OTA that do not employ negative feedback. In other words, instead of employing feedback to reduce the sensitivity of a circuit's performance to device parameters.

Figure 12B:
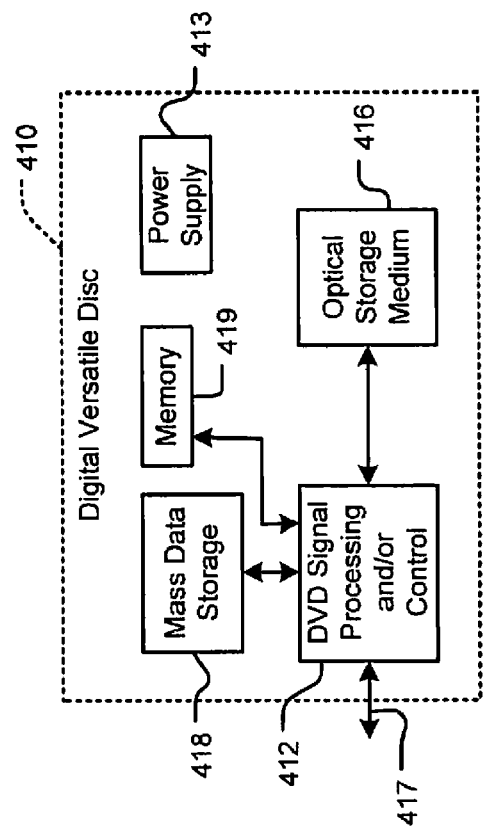
FIG. 12B is a functional block diagram of a digital versatile disk (DVD)
Figure 12A:
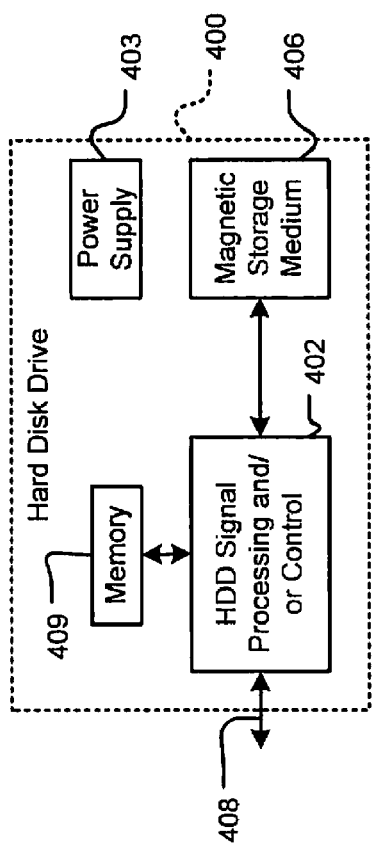
FIG. 12A is a functional block diagram of a hard disk drive.

Referring now to FIGS. 12A-12G, various exemplary implementations of the present invention are shown. Referring now to FIG. 12A, the present invention can be implemented amplifiers, ADC, DAC, filters and other circuits in a hard disk drive 400. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage.

Referring now to FIG. 12B, the present invention can be implemented in amplifiers, ADC, DAC, filters and other circuits of a digital versatile disc (DVD) drive 410. The signal processing and/or control circuit 412 and/or other circuits (not shown) in the DVD 410 may process data, perform coding and/or encryption, perform calculations, and/or format data that is read from and/or data written to an optical storage medium 416. In some implementations, the signal processing and/or control circuit 412 and/or other circuits (not shown) in the DVD 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD 410 may communicate with mass data storage 418 that stores data in a nonvolatile manner. The mass data storage 418 may include a hard disk drive (HDD). The HDD may have the configuration shown in FIG. 12A. The HDD may be a mini HDD that includes one or more platters having a diameter that is smaller than approximately 1.8". The DVD 410 may be connected to memory 419 such as RAM, ROM, low latency nonvolatile memory such as flash memory and/or other suitable electronic data storage.

Figure 12D:
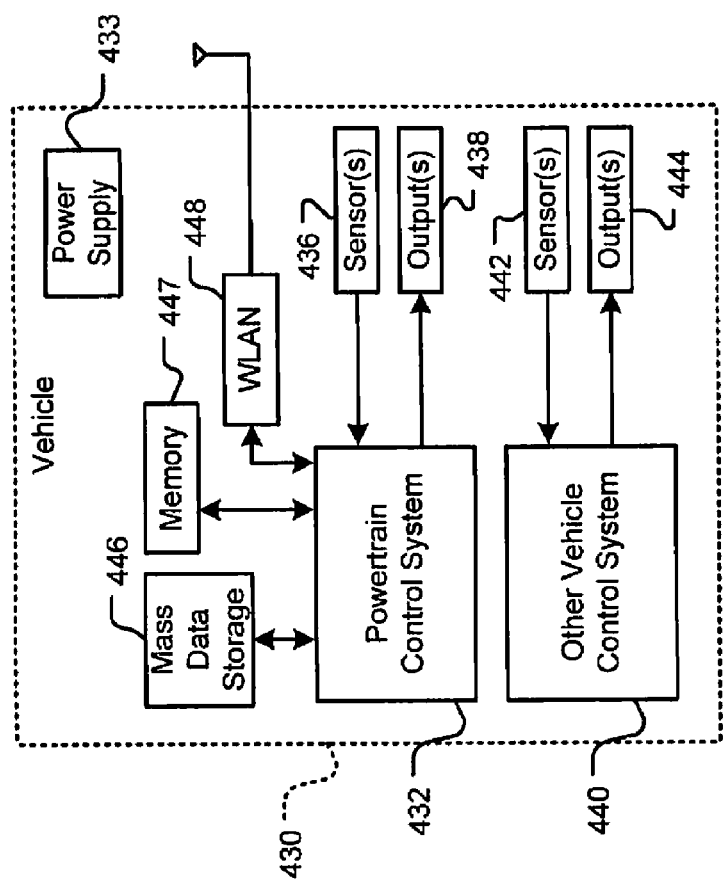
FIG. 12D is a functional block diagram of a vehicle control system.
Figure 12C:
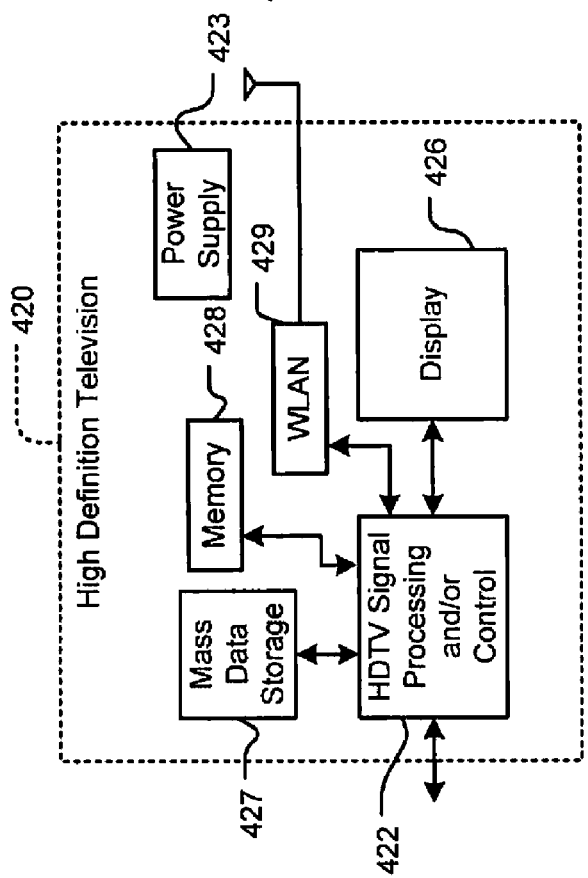
FIG. 12C is a functional block diagram of a high definition television.

Referring now to FIG. 12C, the present invention can be implemented in amplifiers, ADC, DAC, filters and other circuits of a high definition television (HDTV) 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 12A and/or at least one DVD may have the configuration shown in FIG. 12B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Referring now to FIG. 12D, the present invention may implement and/or be implemented in amplifiers, ADC, DAC, filters and other circuits of a control system of a vehicle 430, a WLAN interface, mass data storage of the vehicle control system and/or a power supply 433. In some implementations, the present invention implement a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. At least one HDD may have the configuration shown in FIG. 12A and/or at least one DVD may have the configuration shown in FIG. 12B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 12E:
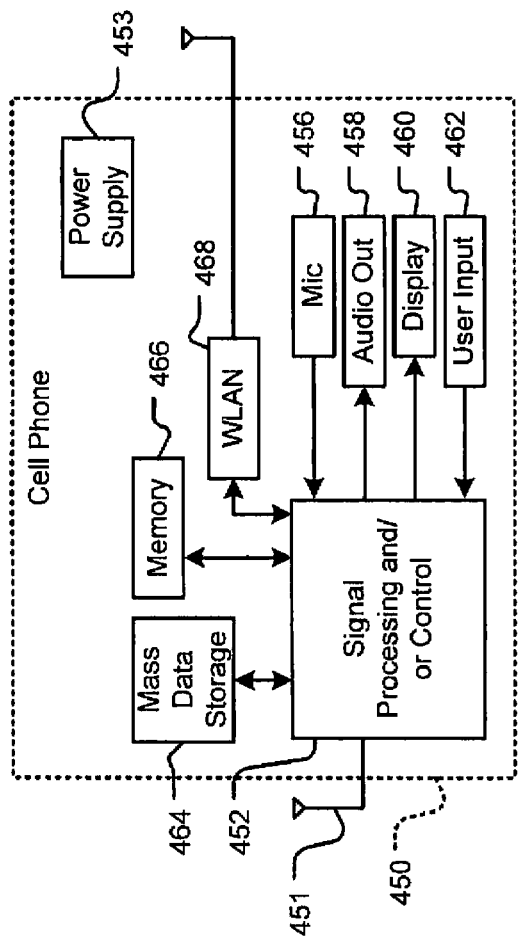
FIG. 12E is a functional block diagram of a cellular phone.

Referring now to FIG. 12E, the present invention can be implemented in amplifiers, ADC, DAC, filters and other circuits of a cellular phone 450 that may include a cellular antenna 451. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. At least one HDD may have the configuration shown in FIG. 12A and/or at least one DVD may have the configuration shown in FIG. 12B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 12F:
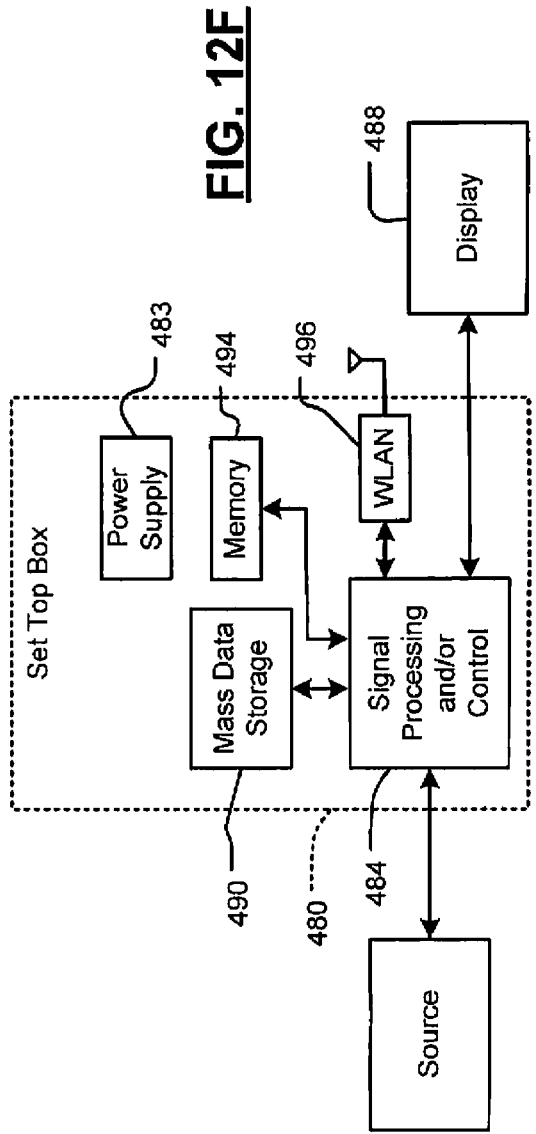
FIG. 12F is a functional block diagram of a set top box.

Referring now to FIG. 12F, the present invention can be implemented in amplifiers, ADC, DAC, filters and other circuits of a set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. At least one HDD may have the configuration shown in FIG. 12A and/or at least one DVD may have the configuration shown in FIG. 12B. The HDD may be a mini HDD that includes one or more platters having a diameter that is smaller than approximately 1.8". The set top box 480 may be connected to memory 4124 such as RAM, ROM, low latency nonvolatile memory such as flash memory and/or other suitable electronic data storage. The set top box 480 also may support connections with a WLAN via a WLAN network interface 4126.

Figure 12G:
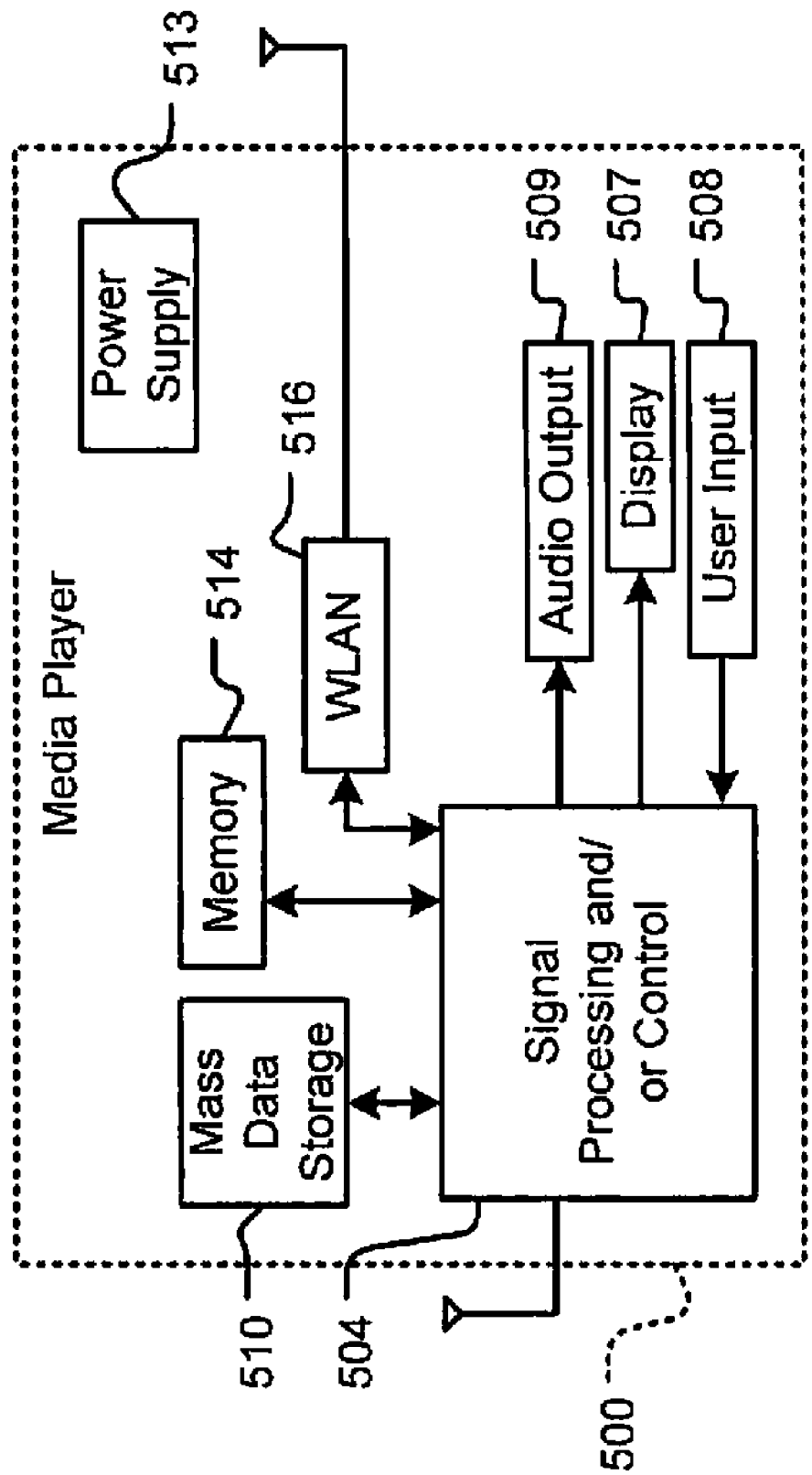
FIG. 12G is a functional block diagram of a media player.

Referring now to FIG. 12G, the present invention can be implemented in amplifiers, ADC, DAC, filters and other circuits of a media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 12A and/or at least one DVD may have the configuration shown in FIG. 12B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Figure 13:
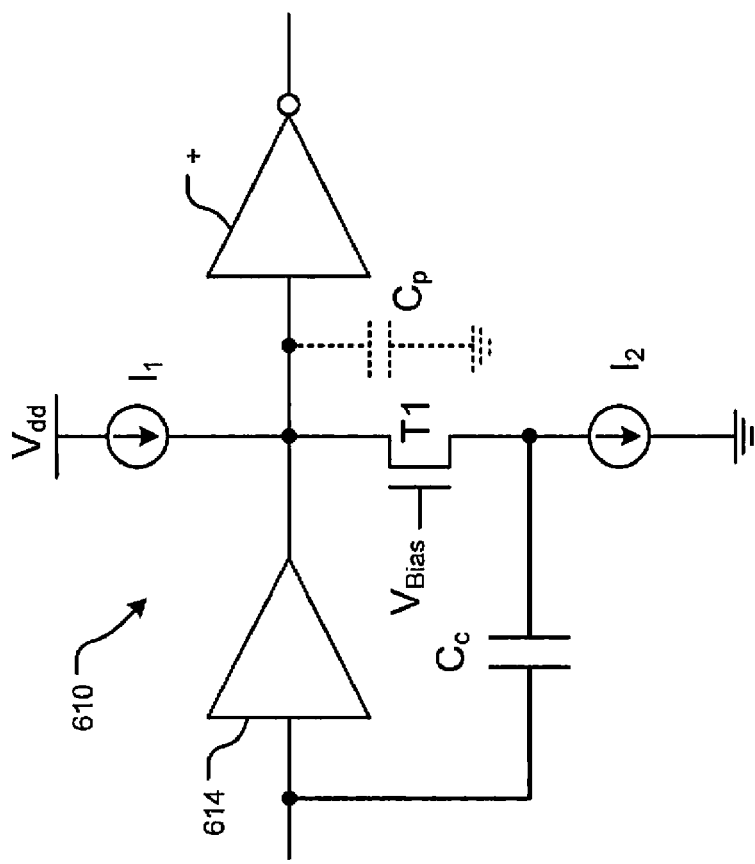
FIG. 13 is an electrical schematic of another alternate amplifier with compensation.

Referring now to FIG. 13, an electrical schematic of another alternate amplifier system 610 with compensation is shown. The amplifier system 610 includes a first amplifier stage 614 and a second amplifier stage 616. An input of the first amplifier stage 614 communicates with one end of a first capacitance $C_c$. An output of the amplifier stage 614 is connected to the input of the second amplifier stage 616.

A first terminal of a first transistor T1 is connected to an output of the first amplifier stage 614. A second terminal of the transistor T1 is connected to another end of the first capacitance $C_c$ and to a current source $I_2$. Another current source $I_1$ is connected to the output of the first amplifier stage 614. The current source $I_1$ may communicate with a first voltage reference $V_{dd}$. A parasitic capacitance $C_p$ exists at the input of the second amplifier stage 616. A voltage bias $V_{bias}$ is input to a control terminal of the transistor T1.

One of amplifiers stages 614 and 616 can be an inverting amplifier. The current sources $I_1$ and $I_2$ may source and sink substantially equal current magnitudes, respectively. The transistor T1 may be a CMOS transistor or any other suitable transistor. The effective gain of the amplifier is approximately equal to $$\frac{C_c}{C_p}.$$

The amplifier system 610 of FIG. 13 tends to have a higher bandwidth and lower noise relative to comparable amplifiers with feed forward gain. The circuit is arranged in a common gate current amplifier configuration.

Figure 14:
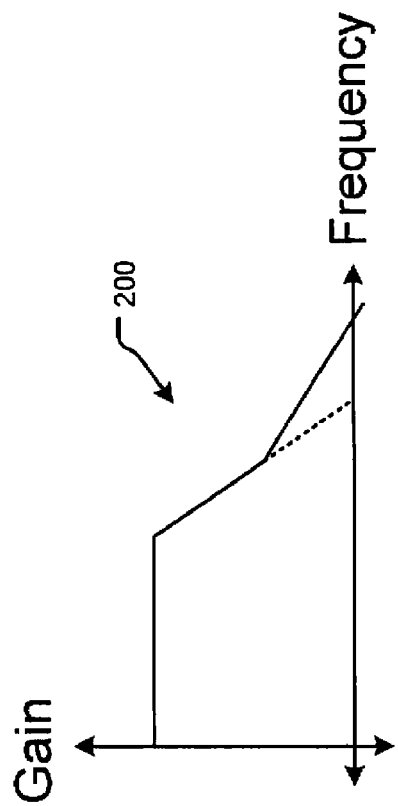
FIG. 14 is a graph illustrating exemplary gain and bandwidth for the amplifier of FIG. 13.

Referring now to FIG. 14, a graph illustrating exemplary gain and bandwidth for the amplifier of FIG. 13 is shown. The amplifier system 610 has similar gain/bandwidth characteristics as those described above.

Figure 15A:
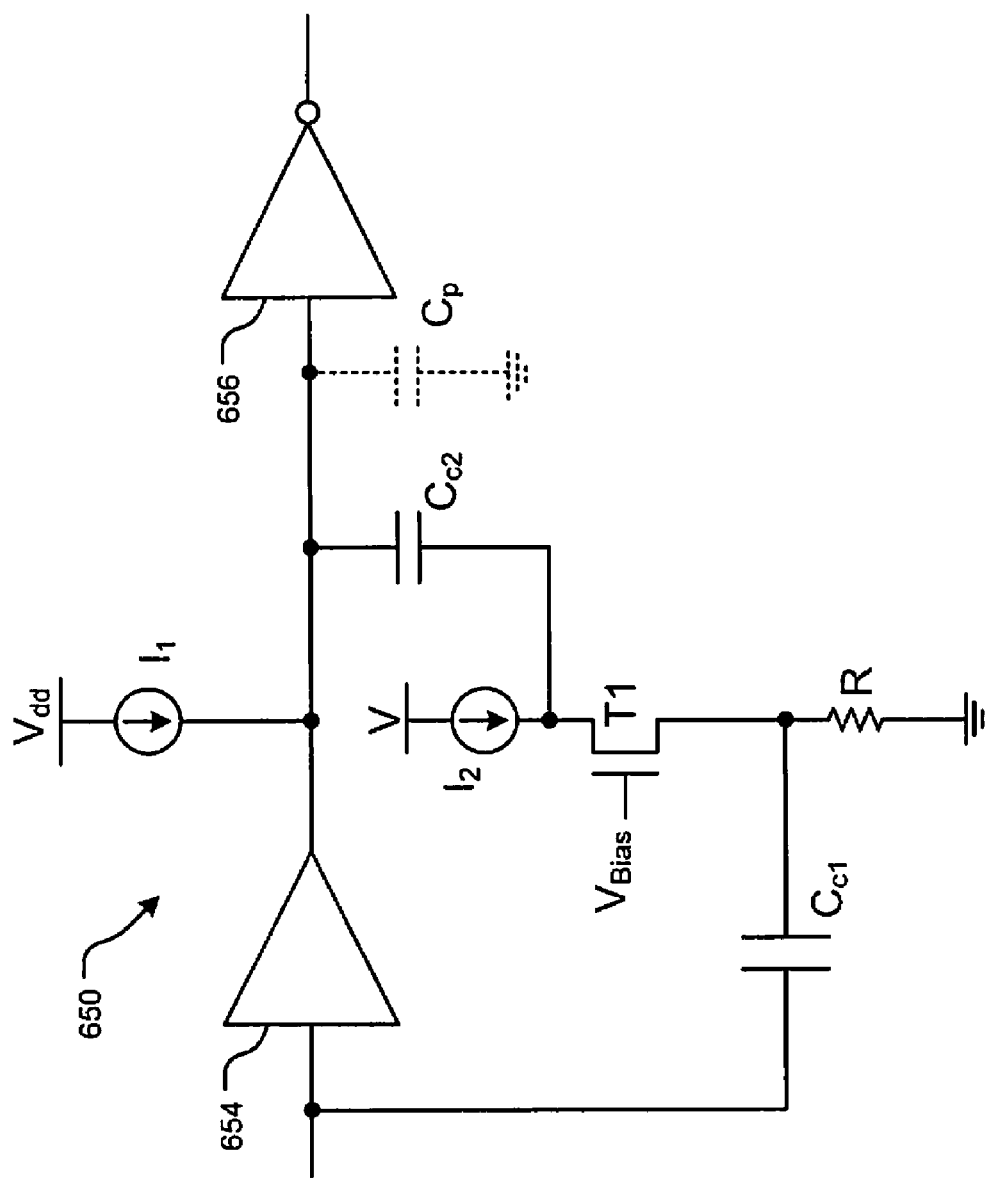
FIGS. 15A and 15B are electrical schematics of other alternate amplifiers with compensation.
Figure 15B:
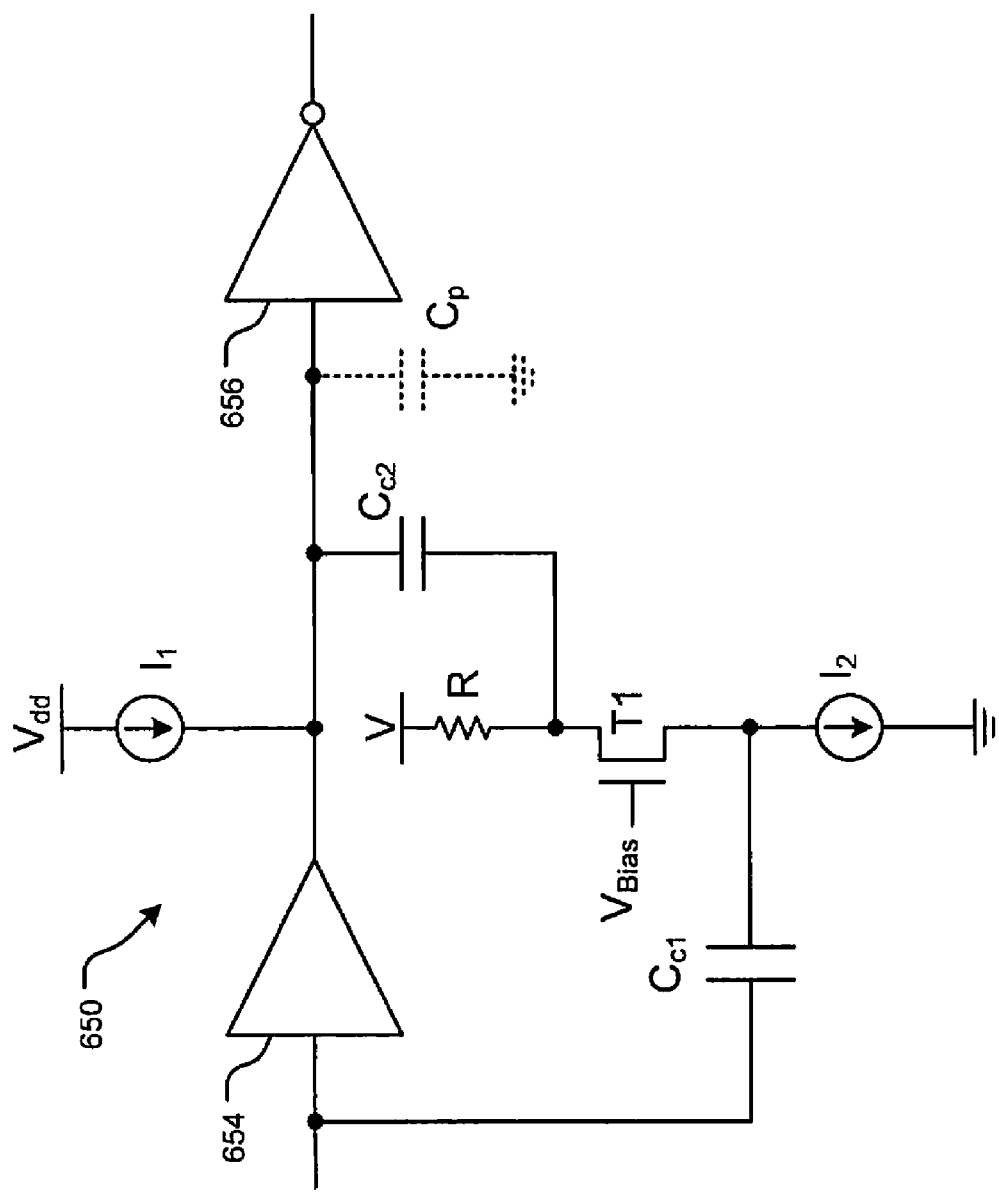

Referring now to FIGS. 15A and 15B, electrical schematics of other alternate amplifier systems 650 with compensation are shown. In FIG. 15A, the amplifier system 650 includes a first amplifier stage 654 and a second amplifier stage 656. An input of the first amplifier stage 654 communicates with one end of a first capacitance $C_{c1}$. An output of the amplifier stage 654 is connected to the input of the second amplifier stage 656.

A second terminal of the transistor T1 is connected to another end of the first capacitance $C_{c1}$ and to a resistance R. A first terminal of the transistor T1 communicates with a current source $I_2$ and with one end of a capacitance $C_{c2}$. Another end of the capacitance $C_{c2}$ communicates with an output of the first amplifier stage 654 and an input of the second amplifier stage 656. Another current source $I_1$ is connected to the output of the first amplifier stage 654. A parasitic capacitance $C_p$ exists at the input of the second amplifier stage 656.

The amplifier system 650 can accommodate problems that occur when the current sources $I_1$ and $I_2$ do not provide equal current levels. The first terminal of the transistor T1 is connected to the current source $I_2$ and capacitively coupled to the output of the first amplifier stage 654 and the input of the second amplifier stages 656. The first voltage references $V_{dd}$ and a second voltage reference V may be substantially equal voltage references or different voltage references. At high frequency, the gain of the amplifier systems is similar to the amplifier system of FIG. 13.

In FIG. 15B, an alternate suitable arrangement is shown. The relative positions of the resistance R and current source $I_2$ are opposite to that shown in FIG. 15A. In other words, one end of the resistance R communicates with a voltage reference V and an opposite end of the resistance R communicates with the first terminal of the transistor T1 and the capacitance $C_{c2}$. The current source I2 communicates with the second terminal of the transistor T1 and another end of the capacitance $C_{c1}$.

The amplifiers described herein may be amplifiers, operational amplifiers, operational transconductance amplifiers (OTAs), amplifiers with Miller compensation and/or other suitable amplifiers.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An amplifier system comprising:
    a first amplifier stage having an input and an output;
    a second amplifier stage having an input and an output, the input of the second amplifier stage being connected to the output of the first amplifier stage;
    a transistor having a control terminal, a first terminal, and a second terminal, the first terminal of the transistor being coupled to the output of the first amplifier stage and the input of the second amplifier stage;
    a first capacitance having a first terminal and a second terminal, the first terminal of the first capacitance being connected to the input of the first amplifier stage, the second terminal of the first capacitance being connected to the second terminal of the transistor;
    a first current source to source current to amplifier system, the first current source being connected to the output of the first amplifier stage; and
    a second current source to sink current from the amplifier system, the second current source being connected to the second terminal of the first capacitance and the second terminal of the transistor.

2. The amplifier system of claim 1, wherein the first current source and the second current source respectively sources and sinks substantially equal current magnitudes.

3. The amplifier system of claim 1, wherein the transistor comprises a complementary metal-oxide semiconductor (CMOS) transistor.

4. The amplifier system of claim 1, wherein the first amplifier stage or the second amplifier stage comprises an inverting amplifier.

5. The amplifier system of claim 1, wherein an effective gain of the amplifier system is approximately equal to $C_c/C_p$, where $C_c$ corresponds to a capacitance of the first capacitance and $C_p$ corresponds to a parasitic capacitance at the input of the second amplifier stage.

6. The amplifier system of claim 1, further comprising a second capacitance that couples the first terminal of the transistor to the output of the first amplifier stage and the input of the second amplifier stage.

7. The amplifier system of claim 1, further comprising a resistor in communication with the first terminal of the transistor.

8. The amplifier system of claim 7, wherein a bias voltage is input to the control terminal of the transistor.

9. The amplifier of claim 7, wherein the first current source and the second current source do not provide equal current magnitudes.

10. The amplifier system of claim 1, wherein each of the first amplifier stage and the second amplifier stage comprises one or more of an amplifier, an operational amplifier, an operational transconductance amplifier (OTA), or an amplifier with Miller compensation.

11. A circuit comprising:
    the amplifier system of claim 1; and
    a switched capacitor circuit in communication with the amplifier system.

12. A device comprising the circuit of claim 11.

13. The device of claim 12, wherein the device comprises one of a hard disk drive, a digital versatile disc drive, a high definition television, a control system of a vehicle, a cellular phone, a set top box, or a media player.

14. An amplifier system comprising:
    a first amplifier stage having an input and an output;
    a second amplifier stage having an input and an output, the input of the second amplifier stage being connected to the output of the first amplifier stage;
    a transistor having a control terminal, a first terminal, and a second terminal, the first terminal of the transistor being coupled to the output of the first amplifier stage and the input of the second amplifier stage;
    a first capacitance having a first terminal and a second terminal, the first terminal of the first capacitance being connected to the input of the first amplifier stage, the second terminal of the first capacitance being connected to the second terminal of the transistor;
    a first current source connected to the output of the first amplifier stage; and
    a second current source connected to the second terminal of the first capacitance and the first terminal of the transistor, 15. The amplifier system of claim 14, further comprising a second capacitance that couples the first terminal of the transistor to the output of the first amplifier stage and the input of the second amplifier stage.

16. The amplifier system of claim 15, further comprising a resistor having a first terminal and a second terminal, the first terminal of the resistor being connected to the second terminal of the transistor, the second terminal of the resistor being connected to a low reference voltage.

17. The amplifier system of claim 16, wherein the first current source and the second current source do not provide equal current magnitudes.

18. The amplifier system of claim 14, wherein each of the first amplifier stage and the second amplifier stage comprises one or more of an amplifier, an operational amplifier, an operational transconductance amplifier (OTA), or an amplifier with Miller compensation.

19. The amplifier system of claim 14, wherein the first amplifier stage or the second amplifier age comprises an inverting amplifier.

20. The amplifier system of claim 14, wherein the transistor comprises a complementary metal-oxide semiconductor (CMOS) transistor.

* * * * *